(12) United States Patent
Weaver et al.

(10) Patent No.: US 6,708,491 B1
(45) Date of Patent: Mar. 23, 2004

(54) DIRECT ACTING VERTICAL THERMAL ACTUATOR

(75) Inventors: Billy L. Weaver, Eagan, MN (US); Douglas P. Goetz, St. Paul, MN (US); Kathy L. Hagen, Stillwater, MN (US); Mike E. Hamerly, Vadnais Heights, MN (US); Robert G. Smith, Vadnais Heights, MN (US); Silva K. Theiss, Woodbury, MN (US)

(73) Assignee: 3M Innovative Properties Company, St. Paul, MN (US)

( * ) Notice: Subject to any disclaimer, the term of this patent is extended or adjusted under 35 U.S.C. 154(b) by 295 days.

(21) Appl. No.: 09/659,572

(22) Filed: Sep. 12, 2000

(51) Int. Cl.$^7$ ............................................... F01B 29/10
(52) U.S. Cl. ......................................... 60/527; 60/528
(58) Field of Search ........................ 60/527, 528, 529; 337/12, 14, 16, 139, 140, 141, 339, 343, 298; 310/306–309

(56) References Cited

U.S. PATENT DOCUMENTS

| | | |
|---|---|---|
| 4,423,401 A | 12/1983 | Mueller |
| 4,679,908 A | 7/1987 | Goodwin |
| 4,688,885 A | 8/1987 | Poteat et al. |
| 5,024,500 A | 6/1991 | Stanley et al. |
| 5,182,910 A | 2/1993 | Benecke |
| 5,206,557 A | 4/1993 | Bobbio |
| 5,290,400 A | 3/1994 | Bobbio |

(List continued on next page.)

FOREIGN PATENT DOCUMENTS

| | | |
|---|---|---|
| EP | 0 672 931 A1 | 9/1995 |
| EP | 0 713 117 A1 | 5/1996 |
| EP | 0 961 150 A2 | 1/1999 |
| EP | 0 924 763 A2 | 6/1999 |
| EP | 0 986 106 A1 | 3/2000 |
| FR | 2 725 038 | 3/1994 |
| WO | 89/09477 | 10/1989 |
| WO | 93/21663 | 10/1993 |
| WO | 96/34417 | 10/1996 |

OTHER PUBLICATIONS

Judy et al., "Surface Micromachined Linear Thermal Microactuator", International Electron Devices Meeting, San Francisco, Dec. 9–12, 1990, IEDM 90–629—632.

Cowen et al., "Vertical Thermal Actuators for Micro–Opto–Electro–Mechanical Systems", 3226 SPIE, pp. 137–146 (1997).

(List continued on next page.)

Primary Examiner—Hoang Nguyen
(74) Attorney, Agent, or Firm—Scott A. Bardell; Bradford B. Wright

(57) ABSTRACT

A micrometer sized, single-stage, vertical thermal actuator capable of repeatable and rapid movement of a micrometer-sized optical device off the surface of a substrate. The vertical thermal actuator is constructed on a surface of a substrate. At least one hot arm has a first end anchored to the surface and a free end located above the surface. A cold arm has a first end anchored to the surface and a free end. The cold arm is located above the hot arm relative to the surface. A member mechanically and electrically couples the free ends of the hot and cold arms such that the member moves away from the substrate when current is applied to at least the hot arm. The hot arm can optionally include a grounding tab to minimize thermal expansion of the cold arm.

35 Claims, 6 Drawing Sheets

U.S. PATENT DOCUMENTS

| | | | |
|---|---|---|---|
| 5,351,412 | A | 10/1994 | Furuhata et al. |
| 5,401,983 | A | 3/1995 | Jokerst et al. |
| 5,418,418 | A | 5/1995 | Hirano et al. |
| 5,489,812 | A | 2/1996 | Furuhata et al. |
| 5,506,175 | A | 4/1996 | Zhang et al. |
| 5,536,988 | A | 7/1996 | Zhang et al. |
| 5,602,955 | A | 2/1997 | Haake |
| 5,685,062 | A | 11/1997 | McCarthy et al. |
| 5,719,073 | A | 2/1998 | Shaw et al. |
| 5,726,480 | A | 3/1998 | Pister |
| 5,846,849 | A | 12/1998 | Shaw et al. |
| 5,847,454 | A | 12/1998 | Shaw et al. |
| 5,880,921 | A | 3/1999 | Tham et al. |
| 5,912,094 | A | 6/1999 | Aksyuk et al. |
| 5,955,817 | A | 9/1999 | Dhuler et al. |
| 5,959,376 | A | 9/1999 | Allen |
| 5,960,132 | A | 9/1999 | Lin |
| 5,962,949 | A | 10/1999 | Dhuler et al. |
| 5,963,367 | A | 10/1999 | Aksyuk et al. |
| 5,994,159 | A | 11/1999 | Aksyuk et al. |
| 5,995,688 | A | 11/1999 | Aksyuk et al. |
| 6,014,240 | A | 1/2000 | Floyd et al. |
| 6,067,797 | A | 5/2000 | Silverbrook |
| 6,070,656 | A | 6/2000 | Dickey |
| 6,236,300 | B1 | 5/2001 | Minners |
| 6,275,325 | B1 | 8/2001 | Sinclair |
| 6,438,954 | B1 * | 8/2002 | Goetz et al. .................. 60/527 |
| 6,483,419 | B1 * | 11/2002 | Weaver et al. ................. 607/5 |
| 6,531,947 | B1 * | 3/2003 | Weaver et al. .............. 337/139 |
| 2002/0195674 | A1 | 12/2002 | Weaver et al. |
| 2003/0038703 | A1 | 2/2003 | Weaver et al. |
| 2003/0137389 | A1 | 7/2003 | Weaver et al. |

OTHER PUBLICATIONS

Harsh et al., "The Realization and Design Considerations of a Flip–Chip Intergarated MEMS Tunabel Capacitor", 80 Sensors and Actuators, pp. 108–118 (2000).

Harsh et al., "Flip–Chip Assembly for SI–Based RF MEMS", IEEE Conference on Micromechanical Systems, 35 pp. 273–278 (1999).

Feng et al., "MEMS–Based Variable Capacitor for Millimeter–Wave Applications", Soild State Sensor and Actuator Workshop, pp. 255–258 (2000).

Noworolski et al., "Process for In–Plane and Out–of–Plane Single–Crystal–Silicon Thermal Microactuators", 55 Sensors and Actuators, pp. 65–69 (1996).

Riethmuller et al., "Thermally Excited Silicon Microactuators", 3 IEEE Transactions on Electron Devices, pp. 758–763 (1988).

Thielicle et al., "Microactuators and Their Technologies", 10 Mechatronics, pp. 431–455 (2000).

Burns et al., Design and Performance of a Double Hot Arm Polysilicon Thermal Actuator, 3224 SPIE, pp. 296–306 (1997).

Read et al., "Mechanical and Optical Characterization of Thermal Microactuators Fabricated in a CMOS Process", 2642 SPIE, pp. 22–32 (1995).

Comtois et al., "Thermal Microactuators for Surface–Micromachining Processes", 2642 SPIE, pp. 10–21 (1995).

Comtois et al., "Characterization of Electrothermal Actuators and Arrays fabricated in a Four–level, Planarized Surface–Micromachined and Polycrystalline Silicon Process", Intl' Conf. On Solid–State Sensors and Actuators, pp. 679–772 (1997).

Reid et al., "Automated Assembly of Flip–Up Micromirrors". 66 Sensors and Actuators, pp. 292–298 (1998).

Toshiyoshi et al., "Electromagnetic Torsion Mirrors for Self–Aligned Fiber–optic Crossconnectors by Micromachining", 5 IEEE Journal of Selected Topics in Quantum Mechanics, pp. 10–17 (1999).

Thielicke et al., "Microactuators and their Technologies", 10 Mechatronics, pp. 431–455 (2000).

Chiou et al., "A Micromirror Device with Tilt and Piston Motions", 3893 SPIE, pp. 298–303 (1999).

Aksyuk et al., "Stress–Induced Curvature Engineering in Surface–Micromachined Devices", 3680 SPIE, pp. 984–993 (1999).

Koester et al., "MUMPs™ Design Handbook", Revision 5.0 Cronos Integrated Microsystems, pp. 1–38 (2000).

Reid et al., "Automated Assembly of Flip–up Micromirrors", Sensors and Actuators, A 66 (1988) 292–298.

* cited by examiner

DIRECT ACTING VERTICAL THERMAL ACTUATOR

FIELD OF THE INVENTION

The present invention relates generally to micromechanical devices, and more particularly, to a micrometer sized, single-stage, vertical thermal actuator capable of repeatable and rapid movement of a micrometer-sized device off the surface of a substrate.

BACKGROUND OF THE INVENTION

Fabricating complex micro-electro-mechanical systems (MEMS) and micro-optical-electro-mechanical systems (MOEMS) devices represents a significant advance in micro-mechanical device technology. Presently, micrometer-sized analogs of many macro-scale devices have been made, such as for example hinges, shutters, lenses, mirrors, switches, polarizing devices, and actuators. These devices can be fabricated, for example, using Multi-user MEMS processing (MUMPs) available from Cronos Integrated Microsystems located at Research Triangle Park, N.C. Applications of MEMS and MOEMS devices include, for example, data storage devices, laser scanners, printer heads, magnetic heads, micro-spectrometers, accelerometers, scanning-probe microscopes, near-field optical microscopes, optical scanners, optical modulators, micro-lenses, optical switches, and micro-robotics.

One method of forming a MEMS or MOEMS device involves patterning the device in appropriate locations on a substrate. As patterned, the device lies flat on top of the substrate. For example, the hinge plates of a hinge structure or a reflector device are both formed generally coplanar with the surface of the substrate using the MUMPs process. One challenge to making use of these devices is moving them out of the plane of the substrate.

Coupling actuators with micro-mechanical devices allows for moving these devices out of the plane of the substrate. Various types of actuators, including electrostatic, piezoelectric, thermal and magnetic have been used for this purpose.

One such actuator is described by Cowan et al. in "Vertical Thermal Actuator for Micro-Opto-Electro-Mechanical Systems", v.3226, SPIE, pp. 137–46 (1997). The actuator 20 of Cowan et al. illustrated in FIG. 1 uses resistive heating to induce thermal expansion. The hot arm 22 is higher than the cantilever arm 24, so that thermal expansion drives the actuator tip 26 toward the surface of the substrate 28. At sufficiently high current, the downward deflection of the actuator tip 26 is stopped by contact with the substrate 28 and the hot arms 22 bow upward. Upon removal of the drive current the hot arms 22 rapidly "freeze" in the bowed shape and shrink, pulling the actuator tip 26 upward, as illustrated in FIG. 2.

The deformation of the hot arm 22 is permanent and the actuator tip 26 remains deflected upward without applied power, forming a backbent actuator 32. Further application of the drive current causes the backbent actuator 32 to rotate in the direction 30 toward the surface of the substrate 28. The backbent actuator 32 of FIG. 2 is typically used for setup or one-time positioning applications. The actuators described in Cowan et al. are limited in that they cannot rotate or lift hinged plates substantially more than forty-five degrees out-of-plane in a single actuation step.

Harsh et al., "Flip Chip Assembly for Si-Based Rf MEMS" Technical Digest of the Twelfth IEEE International Conference on Micro Electro Mechanical Systems, IEEE Microwave Theory and Techniques Society 1999, at 273–278; Harsh et al., "The Realization and Design Considerations of a Flip-Chip Integrated MEMS Tunable Capacitor" 80 Sensors and Actuators 108–118 (2000); and Feng et al., "MEMS-Based Variable Capacitor for Millimeter-Wave Applications" Solid-State Sensor and Actuator Workshop, Hilton Head Island, S.C. 2000, at 255–258 disclose various vertical actuators based upon a flip-chip design. During the normal release etching step, the base oxide layer is partially dissolved and the remaining MEMS components are released. A ceramic substrate is then bonded to the exposed surface of the MEMS device and the base polysilicon layer is removed by completing the etch of the base oxide layer (i.e., a flip chip process). The resultant device, which is completely free of the polysilicon substrate, is a capacitor in which the top plate of the capacitor is controllably moved in a downward fashion toward an opposing plate on the ceramic substrate. The device is removed from the polysilicon substrate because stray capacitance effects of a polysilicon layer would at a minimum interfere with the operation of the device.

Lift angles substantially greater than forty-five degrees are achievable with a dual-stage actuator system. A dual-stage actuator system typically consists of a vertical actuator and a motor. The vertical actuator lifts the hinged micro-mechanical device off of the substrate to a maximum angle not substantially greater than forty-five degrees. The motor, which has a drive arm connected to a lift arm of the micro-mechanical device, completes the lift. One such dual-stage assembly system is disclosed by Reid et al. in "Automated Assembly of Flip-Up Micromirrors", Transducers '97, Int'l Conf. Solid-State Sensors and Actuators, pp. 347–50 (1997). These dual stage actuators are typically used for setup or one-time positioning applications.

The dual-stage actuator systems are complex, decreasing reliability and increasing the cost of chips containing MEMS and MOEMS devices. As such, there is a need for a micrometer sized vertical thermal actuator that is capable of repeatable and rapid movement of a micrometer-sized device off the surface of the substrate.

BRIEF SUMMARY OF THE INVENTION

The present invention is directed to a micrometer sized vertical thermal actuator capable of repeatable and rapid movement of a micrometer-sized optical device off the surface of the substrate.

The vertical thermal actuator is constructed on a surface of a substrate. At least one hot arm has a first end anchored to the surface and a free end located above the surface. A cold arm has a first end anchored to the surface and a free end. The cold arm is located above the hot arm relative to the surface. A member mechanically and electrically couples the free ends of the hot and cold arms such that the member moves away from the substrate when current is applied to the at least one hot arm.

In one embodiment, the hot arm and the cold arm comprise a circuit through which electric current is passed. In another embodiment, a grounding tab electrically couples the hot arm to the substrate. In the embodiment with the grounding tab, the cold arm can optionally be electrically isolated from the hot arm.

One or more of the free ends optionally include a dimple supporting the member above the surface of the substrate. The cold arm can be located directly over the hot arm. The first end of the hot arm can be attached to the substrate adjacent to the first end of the cold arm or offset from the first end of the cold arm. A metal layer optionally extends along the cold arm. In one embodiment, the at least one hot arm comprises two hot arms each having a first end anchored to the surface and free ends located above the surface.

In another embodiment, the vertical thermal actuator has a first beam with a first end anchored to the surface and a free end located above the surface. A second beam has a first end anchored to the surface and a free end located above the surface. A member electrically and mechanically couples the free end of the first beam to the free end of the second beam. A third beam has a first end anchored to the surface and a free end mechanically coupled to the member. The third beam is located above the first and second beams relative to the surface. First and second electrical contacts are electrically coupled to the first ends of the first and second beams, respectively, such that current supplied to the first and second contacts causes the first and second beams to thermally expand and the member to move in an arc away from the substrate.

In one embodiment, the third beam is located generally over the first and second beams. The third beam may optionally include a metal layer. The first and second beams are generally parallel to the first surface in an unactivated configuration. Electric current is applied to the first and second electrical contacts in an activated configuration so that the first and second beams curved upward away from the surface of the substrate.

In one embodiment, the first end of the third beam is electrically isolated from the substrate. In another embodiment, at least a portion of the current in the first and second beams passes through the third beam. The first and second beams can optionally be electrically coupled to the substrate by a grounding tab.

A plurality of vertical thermal actuators can be formed on a single substrate. At least one optical device can be mechanically coupled to the vertical thermal actuator. The optical device comprises one of a reflector, a lens, a polarizer, a wave-guide, a shutter, or an occluding structure. The optical device can be part of an optical communication system. In another embodiment, a wave-guide is formed on second beam. The wave-guide is preferably integrally formed on second beam using micro-electro-mechanical systems processing.

BRIEF DESCRIPTION OF THE SEVERAL VIEWS OF THE DRAWINGS

Further features of the invention will become more apparent from the following detailed description of specific embodiments thereof when read in conjunction with the accompany drawings.

DETAILED DESCRIPTION OF THE INVENTION

Figure 1:
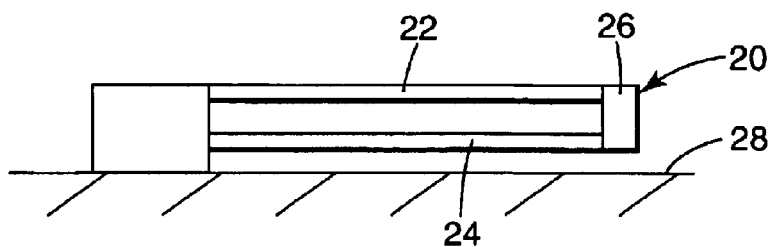
FIG. 1 is a side view of a vertical thermal actuator prior to backbending.
Figure 2:
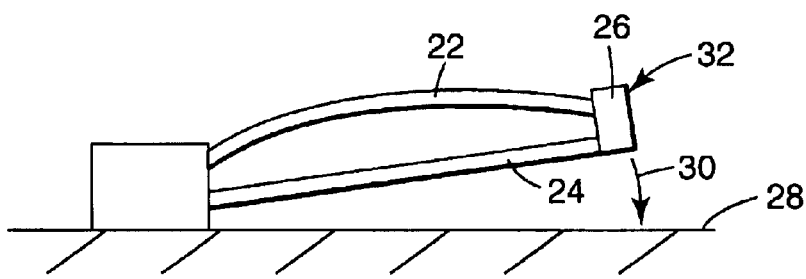
FIG. 2 is a side view of the vertical thermal actuator of FIG. 1 after backbending.

The present invention relates to a single-stage, vertical thermal actuator for micro-mechanical devices. The micrometer sized, single-stage, vertical thermal actuator is capable of repeatable and rapid movement of a micrometer-sized device off the surface of a substrate.

As used herein, "micro-mechanical device" refers to micrometer-sized mechanical, opto-mechanical, electro-mechanical, or opto-electro-mechanical device. Various technology for fabricating micro-mechanical devices is available using the Multi-User MEMS Processes (MUMPs) from Cronos Integrated Microsystems located at Research Triangle Park, N.C. One description of the assembly procedure is described in "MUMPs Design Handbook", revision 5.0 (2000) available from Cronos Integrated Microsystems.

Polysilicon surface micromachining adapts planar fabrication process steps known to the integrated circuit (IC) industry to manufacture micro-electro-mechanical or micro-mechanical devices. The standard building-block processes for polysilicon surface micromachining are deposition and photolithographic patterning of alternate layers of low-stress polycrystalline silicon (also referred to as polysilicon) and a sacrificial material (e.g., silicon dioxide or a silicate glass). Vias etched through the sacrificial layers at predetermined locations provide anchor points to a substrate and mechanical and electrical interconnections between the polysilicon layers. Functional elements of the device are built up layer by layer using a series of deposition and patterning process steps. After the device structure is completed, it can be released for movement by removing the sacrificial material using a selective etchant such as hydrofluoric acid (HF) which does not substantially attack the polysilicon layers.

The result is a construction system generally consisting of a first layer of polysilicon which provides electrical interconnections and/or a voltage reference plane, and additional layers of mechanical polysilicon which can be used to form functional elements ranging from simple cantilevered beams to complex electro-mechanical systems. The entire structure is located in-plane with the substrate. As used herein, the term "in-plane" refers to a configuration generally parallel to the surface of the substrate and the terms "out-of-plane" refer to a configuration greater than zero degrees to about ninety degrees relative to the surface of the substrate.

Typical in-plane lateral dimensions of the functional elements can range from one micrometer to several hundred micrometers, while the layer thicknesses are typically about 1–2 micrometers. Because the entire process is based on standard IC fabrication technology, a large number of fully assembled devices can be batch-fabricated on a silicon substrate without any need for piece-part assembly.

FIGS. 3 through 6 illustrate a first embodiment of a vertical thermal actuator 50 with controlled bending in accordance with the present invention. As used herein, "vertical thermal actuator" refers to a micro-mechanical device capable of repeatably moving an optical device between an in-plane position and an out-of-plane position. The vertical thermal actuator 50 is disposed in-plane on a surface of a substrate 52 typically comprising a silicon wafer 54 with a layer of silicon nitride 56 deposited thereon. The actuator 50 includes a first layer 60 of polysilicon located on the layer of silicon nitride 56. A second layer of polysilicon is configured to have first and second anchors 64, 66 and a pair of beams 68, 70 arranged in a cantilever fashion from the anchors 64, 66 respectively.

Figure 3:
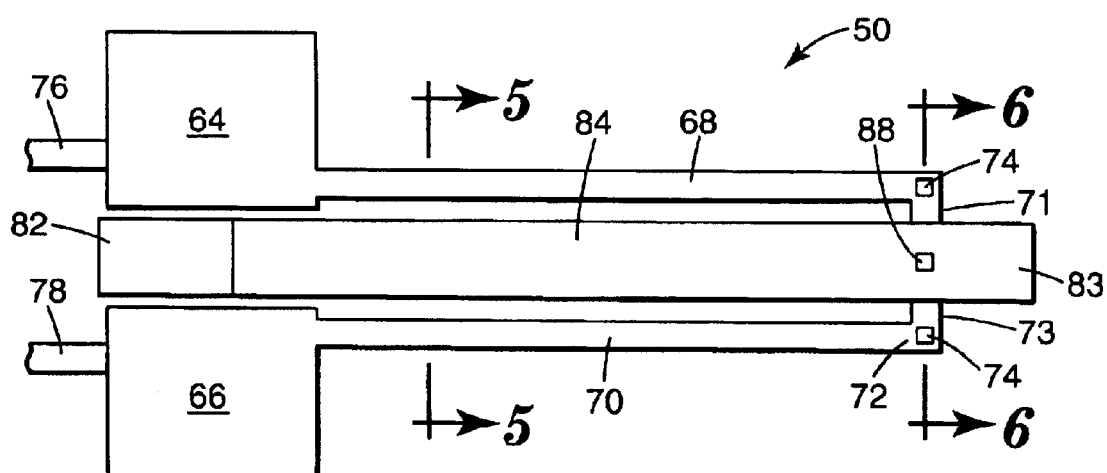
FIG. 3 is a top view of a vertical thermal actuator in accordance with the present invention.
Figure 4:
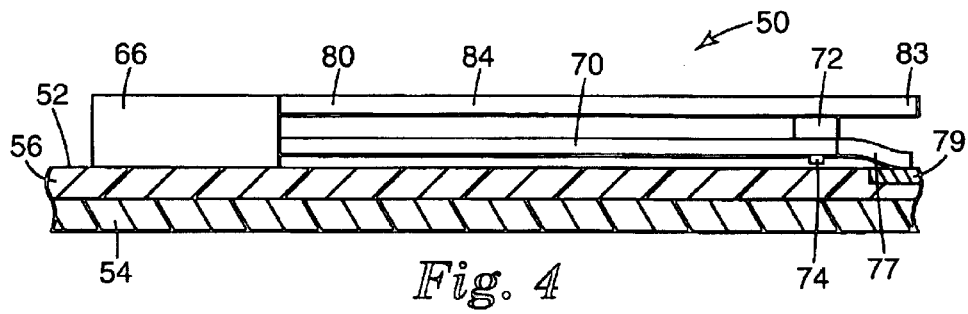
FIG. 4 is a side view of the vertical thermal actuator of FIG. 3.
Figure 5:
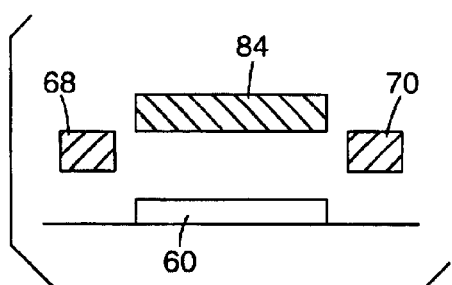
FIG. 5 is a sectional view of the vertical thermal actuator of FIG. 3.
Figure 6:
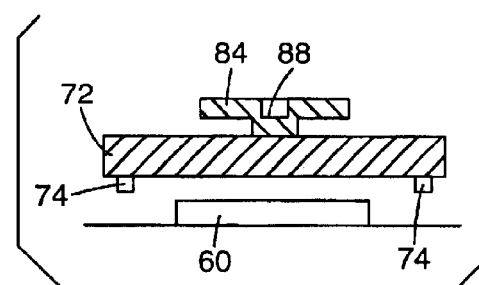
FIG. 6 is a sectional view of the vertical thermal actuator of FIG. 3.

In the embodiment illustrated in FIG. 3, the anchors 64, 66 include electrical contacts 76, 78 formed on the substrate 52 adapted to carry electric current to the beams 68, 70. The traces 76, 78 typically extend to the edge of the substrate 52. Alternatively, a wide variety of electric contact devices and/or packaging methods such as a ball grid array (BGA), land grid array (LGA), plastic leaded chip carrier (PLCC), pin grid array (PGA), edge card, small outline integrated circuit (SOIC), dual in-line package (DIP), quad flat package (QFP), leadless chip carrier (LCC), chip scale package (CSP) can be used to deliver electric current to the beams 68, 70.

The beams 68, 70 are electrically and mechanically coupled at their respective free ends 71, 73 by member 72 to form an electric circuit. In an alternate embodiment, beams 68, 70 are electrically coupled to grounding tab 77. The grounding tab 77 electrically couples the beams 68, 70 to an electrical contact 79 on the substrate 52 in both the unactivated configuration (see FIG. 4) and the activated configuration (see FIG. 7). The grounding tab 77 can be a flexible member or a spring member that is adapted to maintain contact with the substrate 52. A grounding tab can be used with any of the embodiments disclosed herein.

The beams 68, 70 are physically separated from the first layer 60 so that the member 72 is located above the substrate 52. One or more dimples 74 may optionally be formed in the member 72 to support the beams 68, 70 above the substrate 52. In an alternate embodiment, the dimples or bumps 74 can be formed on the substrate 52. In an unactivated configuration illustrated in FIG. 4, the beams 68, 70 are generally parallel to the surface of the substrate 52. As used herein, the "unactivated configuration" refers to a condition in which substantially no current is passed through the circuit formed by the beam 68, the member 72 and the beam 70.

A third layer 80 of polysilicon is configured with an anchor 82 attached to the substrate 52 near the anchor 64, 66. The third layer 80 forms upper beam 84 cantilevered from the anchor 82 with a free end 83 mechanically coupled to the member 72 above the beams 68, 70. In one embodiment, a metal layer is optionally applied to the upper beam 84.

A via 88 is formed at the member 72 and/or free end 83 to mechanically couple the free end 83 of the upper beam 84 to the member 72. Other structures may be used to mechanically couple the upper beam 84 to the member 72. The upper beam 84 is generally parallel to surface of the substrate 52 in the unactivated configuration.

Figure 7:
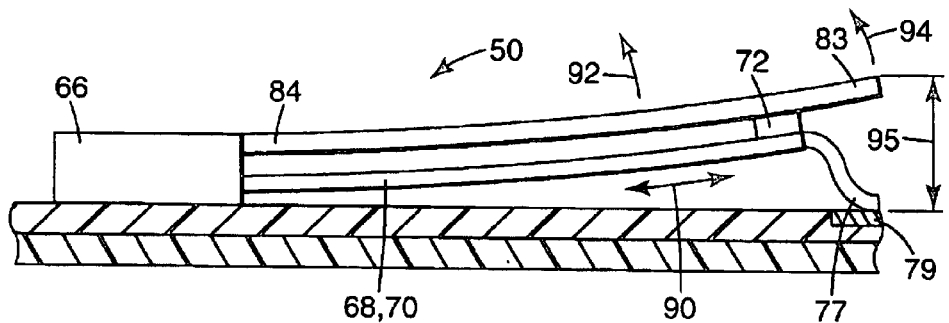
FIG. 7 is a side view of the vertical thermal actuator of FIG. 4 in an actuated position.

FIG. 7 is a side sectional view of the vertical thermal actuator 50 of FIGS. 3–6 in an out-of-plane or activated configuration. The "activated configuration" refers to applying electrical current to one or more of the beams. In the illustrated embodiment, electric current is applied to the circuit formed by the beam 68, the member 72, and the beam 70 (see FIG. 3). The beams 68, 70 are the "hot arms" and the beam 84 is the cold arm. As used herein, "hot arm" or "hot arms" refer to beams or members that have a higher current density than the cold arm(s) when a voltage is applied. "Cold arm" or "cold arms" refer to beams or members that have a lower current density than the hot arm(s) when a voltage is applied. In some embodiments, the cold arm(s) has a current density of zero. Consequently, the hot arms have greater thermal expansion than the cold arms.

The electric current heats the hot arms 68, 70 and causes them to increase in length in the direction 90. Expansion of the beams 68, 70 causes the free end 83 of the vertical thermal actuator 50 to move in an upward arc 92, generating lifting force 94 and displacement 95. The cold arm 84, however, is fixed at the anchor 82 and electrically isolated so that the current entirely or substantially passes through the circuit formed by the hot arms 68, 70 and the member 72.

Due to the height difference between the cold arm 84 and the hot arms 68, 70, a moment is exerted on the cold arm 84 near the anchors 64, 66. The cold arm 84 bends along its length. The hot arms 68, 70 also bend easily, offering little resistance to the motion 92 of the cold arm 84. In the illustrated embodiment, the displacement 95 can be from about 0.5 micrometers to about 4 micrometers. When the current is terminated, the vertical thermal actuator 50 returns to its original, unactivated configuration illustrated in FIG. 4.

In an alternate embodiment, the anchor 82 and the cold arm 84 are electrically coupled to the member 72. At least a portion of the current flowing through the hot arms 68, 70 flows along the cold arm 84 to the anchor 82. It is also possible that all of the current flowing through the hot arms 68, 70 exits the vertical thermal actuator 50 through the cold arm 84. The material and/or geometry of the cold arm 84 is adapted to have a lower current density than the hot arms 68, 70, even when the same voltage is applied. In one embodiment, the cold arm 84 is formed from a material with a coefficient of linear thermal expansion less than the coefficient of linear thermal expansion of the hot arms 68, 70. In yet another embodiment, the cold arm 84 is provided with a lower electrical resistivity by having a larger cross sectional area. In another embodiment, a conductive layer is provided on the cold arm 84. Suitable conductive materials include metals such as aluminum, copper, tungsten, gold, or silver, semiconductors, and doped organic conductive polymers such as polyacetylene, polyaniline, polypyrrole, polythiophene, polyEDOT and derivatives or combinations thereof. Consequently, the net expansion of the hot arms 68, 70 is greater than the expansion of the cold arm 84.

In another alternate embodiment, all or a portion of the current flowing through the hot arms 68, 70 flows through grounding tab 77 to the substrate 52. The grounding tab 77 maintains physical contact with the substrate 52 as the vertical thermal actuator 50 moves from the unactivated position to the activated position illustrated in FIG. 7.

Figure 8:
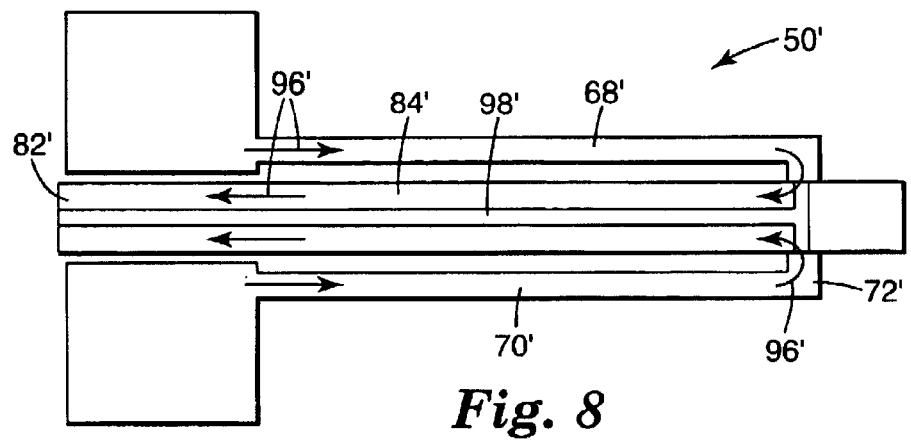
FIG. 8 is a top view of an alternate vertical thermal actuator in accordance with the present invention.

FIG. 8 illustrates an alternate embodiment of a vertical thermal actuator 50' in which the anchor 82' and the beam 84' are not electrically isolated from the member 72'. Current flows in the direction of the arrows 96' from the beams 68', 70', through the member 72' and back to the anchor 82' along the beam 84'. The material and/or geometry of the beam 84' is controlled so that it experiences a lower current density than the beams 68', 70'. In one embodiment, the beam 84' is formed from a material with a coefficient of linear thermal expansion less than the coefficient of linear thermal expansion of the beams 68', 70'. In yet another embodiment, the beam 84' is provided with a lower electrical resistivity by having a larger cross sectional area. In another embodiment, a conductive layer 98' is provided on the beam 84'. Consequently, the net expansion of the beams 68', 70' is greater than the expansion of the beam 84'. Suitable conductive materials include metals such as aluminum, copper, tungsten, gold, or silver, semiconductors, and doped organic conductive polymers such as polyacetylene, polyaniline, polypyrrole, polythiophene, polyEDOT and derivatives or combinations thereof.

Figure 9:
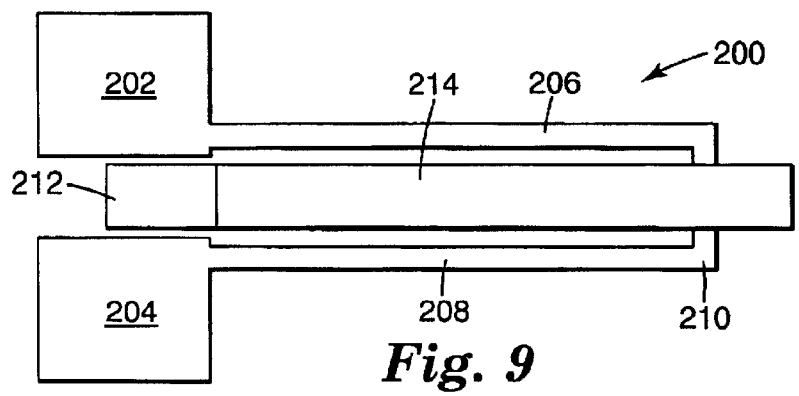
FIGS. 9–11 are top views of vertical thermal actuators with various anchor configurations in accordance with the present invention.

FIG. 9 illustrates an alternate vertical thermal actuator 200 having first and second anchors 202, 204 for the beams 206, 208 located further from the member 210 than the anchor 212 for the beam 214. The vertical thermal actuator 200 of FIG. 9 provides a greater lifting force, with a reduction in total displacement.

Figure 10:
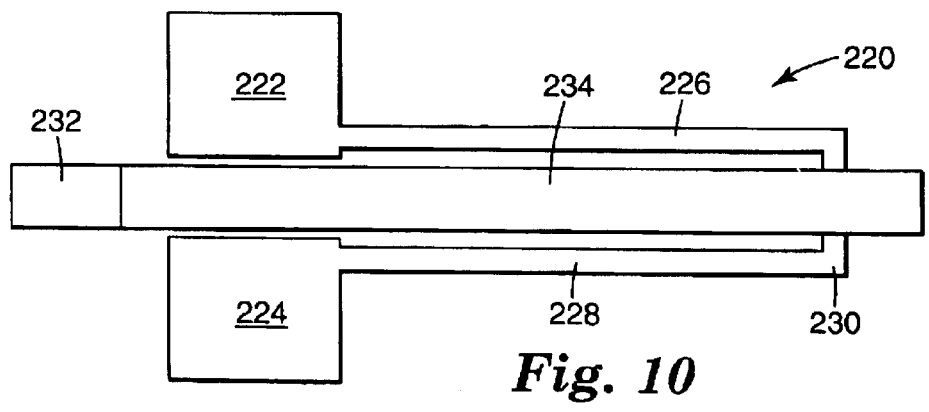

FIG. 10 illustrates an alternate vertical thermal actuator 220 having first and second anchors 222, 224 for the beams 226, 228 located closer to the member 230 than the anchor 232 for the beam 234. The vertical thermal actuator 220 of FIG. 10 provides a greater displacement, with a reduction in total lifting force.

Figure 11:
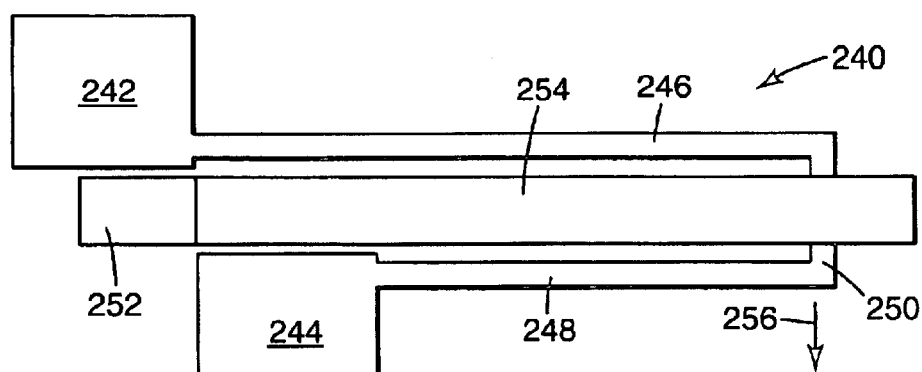

FIG. 11 illustrates an alternate vertical thermal actuator 240 having first anchor 242 for the beam 246 further from the member 250 than the anchor 252 for the beam 254. The second anchors 244 for the beams 248 is located closer to the member 250 than the anchor 252. The thermal expansion for the beams 246, 248 is still greater than any expansion of the beam 254 so that a net lifting force is generated when current is applied to the beams 246, 248. Assuming that the expansion per unit length is the same for the beams 246, 248, the net expansion of the beam 246 will be greater than the expansion of the beam 248. Consequently, the vertical thermal actuator 240 will rise from the substrate with a twisting motion, causing a lateral displacement of the member 250 in a direction 256.

Figure 12:
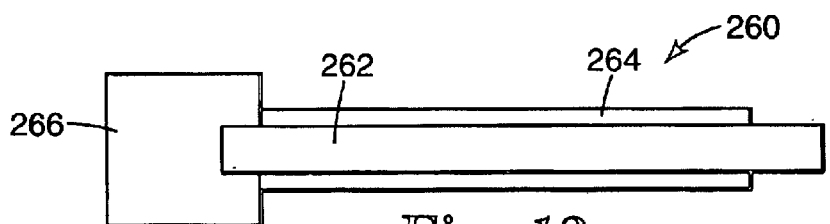
FIG. 12 top view of a two-beam vertical thermal actuator in accordance with the present invention.
Figure 13:
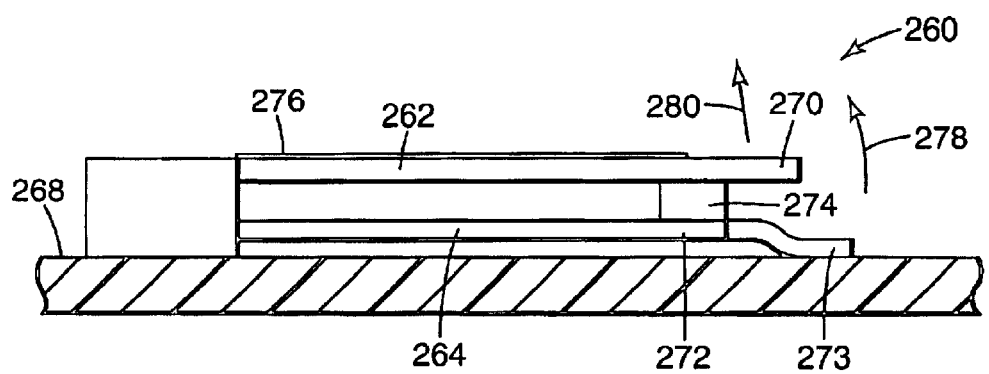
FIG. 13 is a side view of the vertical thermal actuator of FIG. 12.

FIGS. 12 and 13 illustrate a vertical thermal actuator 260 with two beams 262, 264 in accordance with the present invention. The beams 262, 264 extend from anchor 266 in a cantilever fashion above substrate 268. Free ends 270, 272 of the beams 262, 264, respectively, are mechanically and electrically coupled at member 274. In one embodiment, the cold arm or beam 262, the member 274 and the hot arm or beam 264 form a circuit.

The material and/or geometry of the cold arm 262 is controlled so that it experiences a lower current density than the hot arm 264. In one embodiment, the cold arm 262 is formed from a material with a coefficient of linear thermal expansion less than the coefficient of linear thermal expansion of the hot arm 264. In yet another embodiment, the cold arm 262 is provided with a lower electrical resistivity by having a larger cross sectional area and/or a conductive layer 276. Consequently, the net expansion of the hot arm 264 is greater than the expansion of the cold arm 262. When current is applied to the beams 262, 264, the vertical thermal actuator 260 curves upward in direction 278 and generates lifting force 280.

In another embodiment, a grounding tab 273 electrically couples the hot arm 264 to the substrate 268. The grounding tab 273 is preferably flexible or a spring member so that its electrical coupling with the substrate 268 is maintained in the activated state (see generally FIG. 7). Consequently, less current (or no current) flows through the cold arm 262, thereby increasing the total displacement of the vertical thermal actuator 260.

Figure 14:
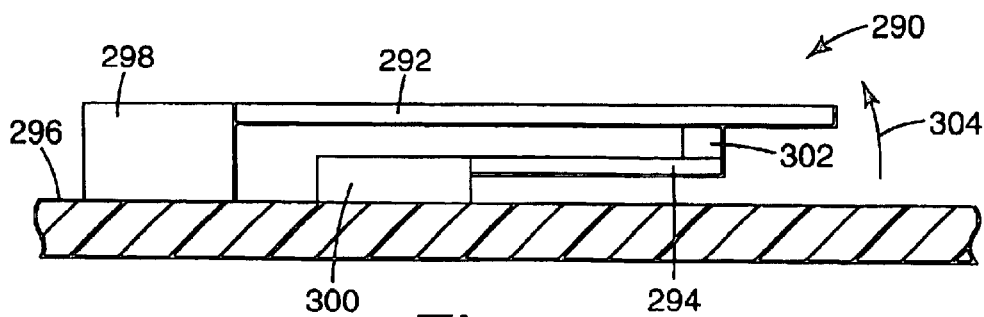
FIG. 14 is a side view of an alternate two-beam vertical thermal actuator in accordance with the present invention.

FIG. 14 is a side view of a vertical thermal actuator 290 with cold arm or beam 292 located generally above hot arm or beam 294, such as illustrated in FIG. 13. The cold arm 292 is attached to substrate 296 by anchor 298. The hot arm 294 is attached to substrate 296 by anchor 300. In one embodiment, the beams 292, 294 are electrically and mechanically coupled at member 302. By locating the anchor 298 further from the member 302 than the anchor 300, the vertical thermal actuator 290 of FIG. 14 is capable of greater displacement in the direction 304, but generates a lower lifting force. In an alternate embodiment, the hot arm 294 can be electrically coupled to the substrate by a grounding tab such as discussed in connection with FIG. 13.

Figure 15:
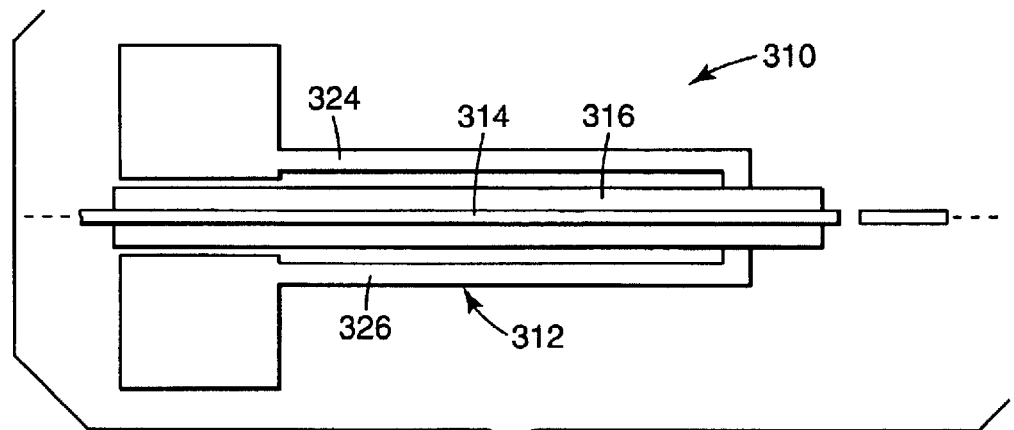
FIGS. 15–17 are various views of a vertical thermal actuator including a wave guide in accordance with the present invention.
Figure 16:
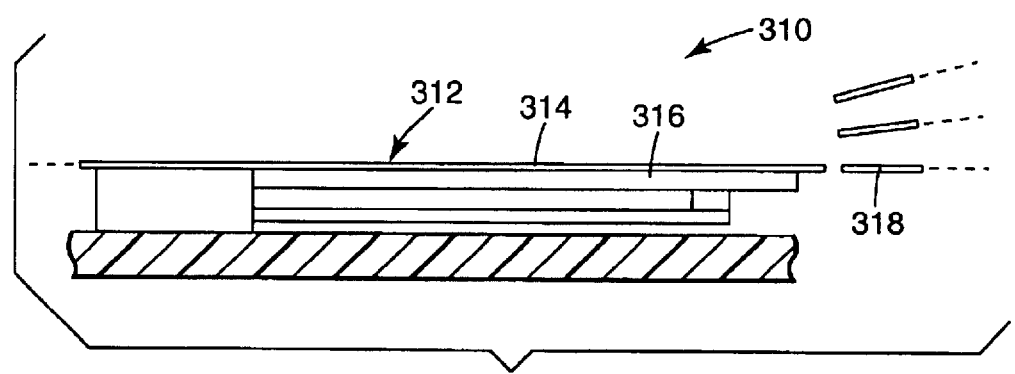
Figure 17:
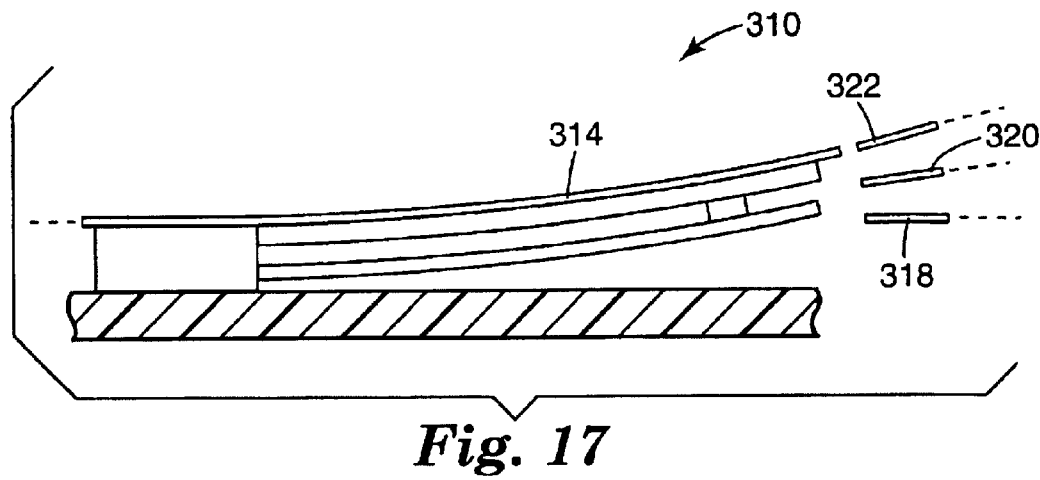

FIGS. 15 through 17 illustrate an optical switch 310 using a vertical thermal actuator 312 generally as illustrated in FIG. 3 with a wave guide 314 attached to the cold arm or beam 316 in accordance with the present invention. The wave guide 314 can be formed as part of the fabrication process or added as a separate component, such as an optical fiber. The wave guide 314 can be effectively located on the cold arm 316 since it experiences little or no thermal expansion. The cold arm 316 is preferably electrically isolated from the hot arms 324, 326.

As best illustrated in FIG. 16, when the vertical thermal actuator 312 is in the deactivated or in-plane configuration, the wave guide 314 is optically coupled with an adjacent wave guide 318. In the activated or out-of-plane configuration illustrated in FIG. 17, the wave guide 314 can be aligned with any of a plurality of other wave guides 320, 322. Consequently, the wave guide 314 can be selectively coupled to any of the wave guides 318, 320, 322 by varying the current applied to the vertical thermal actuator 312.

Figure 18:
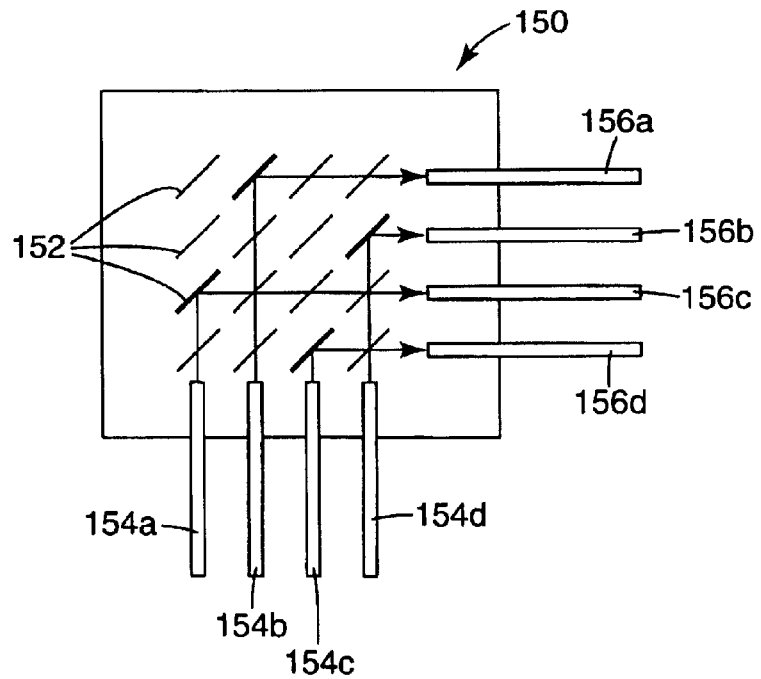
FIG. 18 is a schematic illustration of an optical switch in accordance with the present invention.

FIG. 18 is schematic illustration of an optical switch 150 utilizing a 4×4 array of optical devices 152. As used herein, "optical device" refers to reflectors, lens, polarizing devices, wave guides, shutters, or occlusion devices. Each of the optical devices 152 is mechanically coupled to one or more vertical thermal actuators. In the in-plane position, the optical devices 152 do not extend into the optical path of input optical fibers 154a–154d. In the out-of-plane configuration the optical devices 152 extend into the optical path of the input optical fibers 154a–154d. The array of vertical mirrors 152 are arranged to permit an optical signal from any of the input fibers 154a–154d to be optically coupled with any of the output fibers 156a–156d through selective actuation of the vertical thermal actuators.

The optical switch 150 illustrated in FIG. 18 is for illustration purposes only. Any of the present vertical thermal actuators may be used in a variety of optical switch architectures, such as an on/off switch (optical gate), 2×2 switch, one×n switch, or a variety of other architectures. The optical switch 150 can be part of an optical communication system.

All of the patents and patent applications disclosed herein, including those set forth in the Background of the Invention, are hereby incorporated by reference. Although specific embodiments of this invention have been shown and described herein, it is to be understood that these embodiments are merely illustrative of the many possible specific arrangements that can be devised in application of the principles of the invention. Numerous and varied other arrangements can be devised in accordance with these principles by those of ordinary skill in the art without departing from the scope and spirit of the invention.

What is claimed is:

1. A vertical thermal actuator constructed on a surface of a substrate comprising:
   at least one hot arm having a first end anchored to the surface and a free end located above the surface;
   a grounding tab electrically coupling the hot arm to the substrate;
   a cold arm having a first end anchored to the surface and a free end, the cold arm being located above the hot arm relative to the surface; and
   a member mechanically and electrically coupling the free ends of the hot and cold arms such that the member moves away from the substrate when current is applied to at least the hot arm.

2. The apparatus of claim 1 wherein the cold arm is electrically isolated from the hot arm.

3. The apparatus of claim 1 wherein the hot arm and the cold arm comprise a circuit through which electric current is passed.

4. The apparatus of claim 1 wherein the cold arm is located directly over the hot arm.

5. The apparatus of claim 1 wherein the first end of the hot arm is attached to the substrate adjacent to the first end of the cold arm.

6. The apparatus of claim 1 wherein the first end of the hot arm is attached to the substrate offset to the first end of the cold arm.

7. The apparatus of claim 1 comprising a metal layer extending along the cold arm.

8. The apparatus of claim 1 wherein the at least one hot arm comprises two hot arms each having a first end anchored to the surface and free ends located above the surface.

9. The apparatus of claim 1 comprising a plurality of vertical thermal actuators on the substrate.

10. The apparatus of claim 1 comprising at least one optical device mechanically coupled to the vertical thermal actuator.

11. The apparatus of claim 10 wherein the optical device comprises one of a reflector, a lens, a polarizer, a wave guide, a shutter, or an occluding structure.

12. The apparatus of claim 10 comprising an optical communication system including at least one optical device.

13. The apparatus of claim 1 comprising at least one wave guide formed on the cold beam.

14. A vertical thermal actuator constructed on a surface of a substrate comprising:
   a first beam having a first end anchored to the surface and a free end located above the surface;
   a second beam having a first end anchored to the surface and a free end located above the surface;
   a member electrically and mechanically coupling the free end of the first beam to the free end of the second beam;
   a grounding tab electrically coupling the first and second beams to the substrate;
   a third beam having a first end anchored to the surface and a free end mechanically coupled to the member, the third beam being located above the first and second beams relative to the surface; and
   first and second electrical contacts electrically coupled to the first ends of the first and second beams, respectively, such that current supplied to the first and second contacts causes the first and second beams to thermally expand and the member to move in an arc away from the substrate.

15. The apparatus of claim 14 wherein the first and second beams comprise a circuit through which electric current is passed.

16. The apparatus of claim 14 wherein the third beam is located generally over the first and second beams.

17. The apparatus of claim 14 comprising a metal layer extending along the second beam.

18. The apparatus of claim 14 wherein the first ends of the first, second and third beams are adjacent.

19. The apparatus of claim 14 wherein the first ends of the first and second beams are closer to the member than the first end of the third beam.

20. The apparatus of claim 14 wherein the first ends of the first and second beams are farther from the member than the first end of the third beam.

21. The apparatus of claim 14 wherein the first end of the first beam is loser to the member than the first end of the third beam and the first end of the second eam is farther from the member than the first end of the third beam.

22. The apparatus of claim 14 wherein the first end of the third beam is electrically isolated from the substrate.

23. The apparatus of claim 14 wherein the first and second beams are generally parallel to the first surface in an unactivated configuration.

24. The apparatus of claim 14 comprising electric current applied to the first and second electric contacts in an activated configuration so that the first and second beams curved upward away from the surface of the substrate.

25. The apparatus of claim 24 wherein at least a portion of the current in the first and second beams passes through the third beam.

26. The apparatus of claim 14 wherein the first and second beams comprise polysilicon.

27. The apparatus of claim 14 comprising a metal layer extending along at least one of the first, second and third beams.

28. The apparatus of claim 14 wherein the first and second beams are at an acute angle with respect to the surface in an activated configuration.

29. The apparatus of claim 14 wherein the third beam is generally parallel to the surface in an unactivated configuration.

30. The apparatus of claim 14 wherein one or more of the free ends comprise a dimple supporting the member above the surface of the substrate.

31. The apparatus of claim 14 comprising a wave guide formed on the third beam.

32. The apparatus of claim 14 comprising a plurality of vertical thermal actuators constructed on the substrate.

33. The apparatus of claim 14 comprising at least one optical device mechanically coupled to the vertical thermal actuator.

34. The apparatus of claim 33 wherein the optical device comprises one of a reflector, a lens, a polarizer, a wave guide, a shutter, or an occluding structure.

35. The apparatus of claim 33 comprising an optical communication system including at least one optical device.

* * * * *